United States Patent
Nakamori

(10) Patent No.: US 10,164,626 B2
(45) Date of Patent: Dec. 25, 2018

(54) SEMICONDUCTOR DEVICE AND METHOD OF OUTPUTTING TEMPERATURE ALARM

(71) Applicant: FUJI ELECTRIC CO., LTD., Kawasaki-shi, Kanagawa (JP)

(72) Inventor: Akira Nakamori, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 226 days.

(21) Appl. No.: 15/363,588

(22) Filed: Nov. 29, 2016

(65) Prior Publication Data
US 2017/0077919 A1  Mar. 16, 2017

Related U.S. Application Data

(63) Continuation of application No. PCT/JP2015/081440, filed on Nov. 9, 2015.

(30) Foreign Application Priority Data

Dec. 26, 2014 (JP) .................................. 2014-264683

(51) Int. Cl.
  *H03K 17/082* (2006.01)
  *H02M 1/00* (2006.01)
  (Continued)

(52) U.S. Cl.
  CPC ..... *H03K 17/0828* (2013.01); *H01L 27/0255* (2013.01); *H02M 1/00* (2013.01);
  (Continued)

(58) Field of Classification Search
  USPC ........................... 361/86–87, 93.7–93.9, 103
  See application file for complete search history.

(56) References Cited

U.S. PATENT DOCUMENTS 6,459,380 B1  10/2002 Watanabe et al.
8,779,929 B2 *  7/2014 Komatsu ............ H03K 17/0822
340/584
(Continued)

FOREIGN PATENT DOCUMENTS

CN  104242771 A  12/2014
EP  2991217 A1  3/2016
(Continued)

*Primary Examiner* — Danny Nguyen
(74) *Attorney, Agent, or Firm* — Rabin & Berdo, P.C.

(57) ABSTRACT

A semiconductor device including a semiconductor switch circuit and a drive circuit. The semiconductor switch circuit includes a semiconductor switch and a temperature sensor for detecting a temperature in a periphery of the semiconductor switch. The drive circuit includes an overheating protection unit configured to, upon determining that the detected temperature of the semiconductor switch reaches an overheating protection temperature, perform overheating protection of the semiconductor switch and issue an overheating protection alarm signal. The drive circuit also includes an advance warning control unit configured to set a threshold temperature that is lower than the overheating protection temperature, and upon determining that the detected temperature reaches the threshold temperature, to output an advance warning signal before the overheating protection becomes operational. The overheating protection alarm signal and the advance warning signal are outputted from a same terminal of the drive circuit and are of different signal levels.

10 Claims, 10 Drawing Sheets

(51) Int. Cl.
  *H02M 7/48*    (2007.01)
  *H01L 27/02*   (2006.01)
  *H02M 7/537*   (2006.01)
  *H02M 1/08*    (2006.01)
  *H02M 7/5387*  (2007.01)
  *H01L 29/866*  (2006.01)
  *H03K 17/08*   (2006.01)
  *H02M 1/32*    (2007.01)

(52) U.S. Cl.
  CPC ............... *H02M 1/08* (2013.01); *H02M 7/48* (2013.01); *H02M 7/537* (2013.01); *H02M 7/53875* (2013.01); *H01L 29/866* (2013.01); *H02M 2001/327* (2013.01); *H03K 2017/0806* (2013.01)

(56) References Cited

U.S. PATENT DOCUMENTS

| | | | |
|---|---|---|---|
| 9,225,233 B2 * | 12/2015 | Nakamori | ............... H02M 1/32 |
| 2013/0229840 A1 | 9/2013 | Nakamori | |
| 2014/0361721 A1 | 12/2014 | Yamaguchi | |

FOREIGN PATENT DOCUMENTS

| | | | |
|---|---|---|---|
| JP | 2000-341960 A | 12/2000 | |
| JP | 2002-290482 A | 10/2002 | |
| JP | 3635988 B2 | 4/2005 | |
| JP | 2009-225581 A | 10/2009 | |
| JP | 2013-183595 A | 9/2013 | |
| JP | 2014-239631 A | 12/2014 | |
| WO | WO-2014-174651 A1 | 10/2014 | |

\* cited by examiner

| LEVEL OF SIGNAL s0 | OUTPUT LEVEL OF COMPARATOR 25b-1 | OUTPUT LEVEL OF COMPARATOR 25b-2 | TRANSISTOR ON/OFF | | | LEVEL OF OUTPUT TERMINAL out2 |
|---|---|---|---|---|---|---|
| | | | M11 | M12 | M13 | |
| $V0 \leqq Vmin$ | L | L | ON | OFF | OFF | Vref1 |
| $Vmin < V0 < Vmax$ | H | L | OFF | ON | OFF | Vref2 |
| $Vmax \leqq V0$ | H | H | OFF | OFF | ON | Vref3 |

FIG. 8

SEMICONDUCTOR DEVICE AND METHOD OF OUTPUTTING TEMPERATURE ALARM

CROSS-REFERENCE TO RELATED APPLICATION

This application is a continuation application of International Application PCT/JP2015/081440 filed on Nov. 9, 2015 which designated the U.S., which claims priority to Japanese Patent Application No. 2014-264683, filed on Dec. 26, 2014, the entire contents of which are incorporated herein by reference.

BACKGROUND OF THE INVENTION

1. Field of the Invention

The embodiments discussed herein are related to a semiconductor device and a method of outputting a temperature alarm.

2. Background of the Related Art

Semiconductor devices called intelligent power modules (IPMs) that incorporate insulated gate semiconductor elements (insulated gate bipolar transistors or "IGBTs") and drive circuits for driving the IGBT have been increasingly developed in recent years.

IPMs are power converting modules and are widely used in applications such as AC (Alternating Current) servos, air conditioners, and elevators.

IPMs also have a protector function capable of protecting abnormal circuits and elements when an abnormal state has been detected. As one example, when overheating has been detected, an IPM protects elements by avoiding the overheated area and outputs an alarm to the periphery.

As one example of existing technology, a configuration where the temperature of a semiconductor switch is constantly monitored by inputting the forward voltage drop of a temperature-detecting diode into a regulator and outputting the regulator output to an external terminal has been proposed (see Japanese Laid-open Patent Publication No. 2013-183595).

Another proposed technology determines that there is an abnormality when the chip temperature of a semiconductor switching element exceeds a first predetermined value that is above normal temperature and outputs an advance warning when the chip temperature exceeds a second predetermined value that is above the normal temperature but lower than the first predetermined value (see Japanese Laid-open Patent Publication No. 2000-341960).

A protector function incorporated in an IPM protects the semiconductor elements provided in the IPM during an abnormal state to avoid breakage, so that when an abnormality is detected, the IPM stops driving the IGBT.

This means that it is possible to avoid breakage of internal elements when the IPM has detected an abnormality, but since the driving of the IGBT is stopped by this protector function, an apparatus that is supplied with power from the IGBT may suddenly stop.

According to Japanese Laid-open Patent Publication No. 2000-341960, since an advance warning is outputted before the IPM detects an abnormality and the driving of the IGBT is stopped, a situation where the apparatus that is supplied with power suddenly stops is avoided.

However, with this technology, although it is possible to use a configuration where the advance warning signal is outputted from the same terminal as the alarm signal and use different signal widths for the respective signals, it is not possible to distinguish between the signals until an amount of time corresponding to the signal widths has passed.

Even when a warning signal is outputted when there are signs of an abnormality, control to output an advance warning quickly or slowly in keeping with the operational state of the IPM is not performed.

When an abnormal state of an IPM is very urgent, it is desirable to output an advance warning quickly. Conventionally however, advance warnings have been outputted without regard for the degree of urgency, so that there is the risk of delays in the IPM control system taking suitable measures for the IPM.

SUMMARY OF THE INVENTION

According to an aspect, there is provided a semiconductor device including a semiconductor switch circuit and a drive circuit, wherein the semiconductor switch circuit includes a semiconductor switch and a temperature sensor that detects a temperature of the semiconductor switch in a periphery of the semiconductor switch, and the drive circuit includes: an overheating protection unit configured to perform, when the detected temperature of the semiconductor switch has reached an overheating protection temperature, overheating protection of the semiconductor switch and to also issue an overheating protection alarm signal; an advance warning control unit that sets at least one threshold temperature that is lower than the overheating protection temperature and outputs, when the detected temperature has reached the threshold temperature, an advance warning signal before the overheating protection becomes operational; and a driving control circuit for the semiconductor switch, wherein the overheating protection alarm signal and the advance warning signal are outputted from a same terminal with different signal levels.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A depicts the example configuration and FIG. 1B depicts the operational state;

FIG. 8 depicts operational states of a threshold temperature setting circuit;

DETAILED DESCRIPTION OF THE INVENTION

Figure 1A:
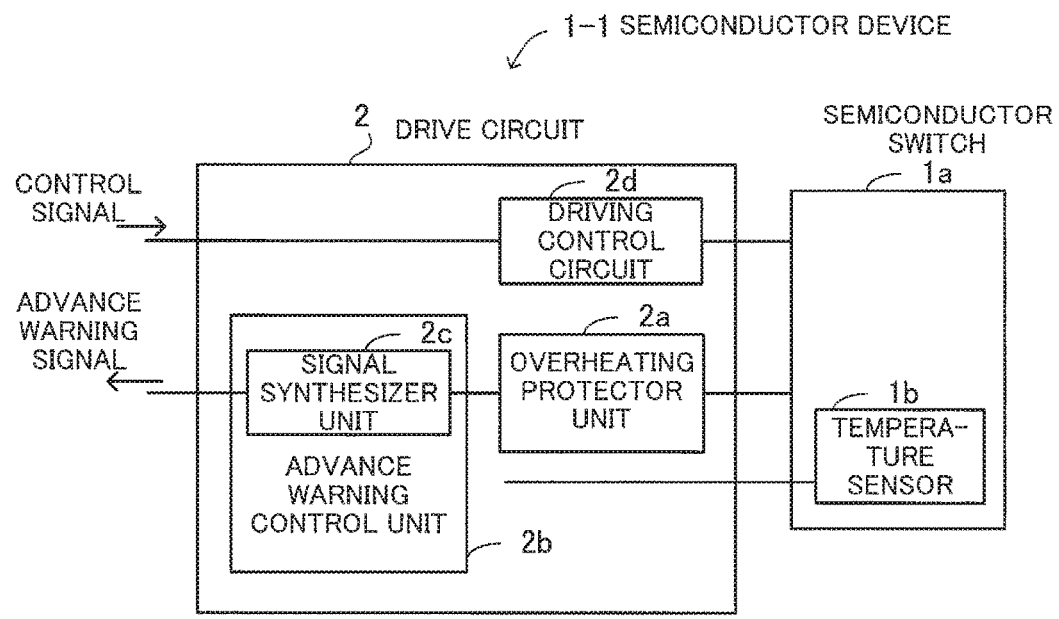
FIGS. 1A and 1B depict an example configuration and operational state of a semiconductor device, where

Several embodiments will be described below with reference to the accompanying drawings, wherein like reference numerals refer to like elements throughout.

First Embodiment

FIG. 1A depicts an example configuration of a semiconductor device. A semiconductor device 1-1 according to the first embodiment is equipped with a semiconductor switch 1a, which includes a temperature sensor 1b, and a drive circuit 2, with the drive circuit 2 including an overheating protector unit 2a, an advance warning control unit 2b, and a driving control circuit 2d.

The overheating protector unit 2a detects the temperature of the semiconductor switch 1a and when the detected temperature reaches an overheating protection temperature, overheating protection is performed for the semiconductor switch 1a.

The advance warning control unit 2b sets a threshold temperature that is lower than the overheating protection temperature. After this, when the detected temperature has reached the selected threshold temperature, the advance warning control unit 2b outputs an advance warning signal before overheating protection becomes operational.

The expression "advance warning signal" refers to a signal for notifying the periphery in advance that the semiconductor switch 1a is overheating before the semiconductor switch 1a reaches an overheating protection state (i.e., a signal that provides forewarning of an overheating protection operation). The driving control circuit 2d drives and controls the semiconductor switch 1a based on a control signal. A signal synthesizer unit 2c synthesizes and outputs signals to be outputted to the periphery.

Figure 1B:
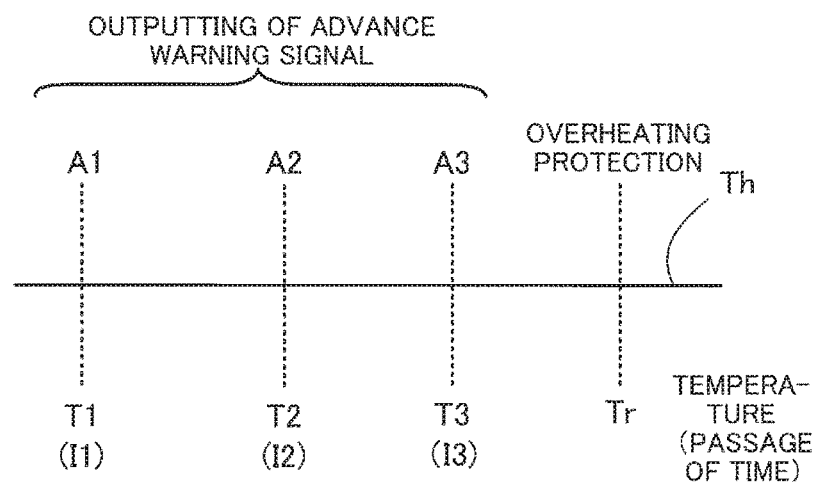

The graph in FIG. 1B depicts the temperature Th of the semiconductor switch 1a and indicates how the temperature rises over time. Here, when the temperature Th of the semiconductor switch 1a reaches an overheating protection temperature Tr, the overheating protector unit 2a activates an overheating protection function to produce an overheating protection operational state where the semiconductor switch 1a is protected from overheating.

Here, values of the current I flowing in the semiconductor switch 1a are expressed as I1, I2, and I3, where I1<I2<I3. The temperature of the semiconductor switch 1a when the current is I1 is set as T1 (or "threshold temperature T1"), the temperature of the semiconductor switch 1a when the current is I2 is set as T2 (or "threshold temperature T2"), and the temperature of the semiconductor switch 1a when the current is I3 is set as T3 (or "threshold temperature T3").

Since the operating temperature of the semiconductor switch 1a increases as the current flowing in the semiconductor switch 1a increases, the temperatures Tr, T1, T2, and T3 are such that T1<T2<T3<Tr.

In this state, the advance warning control unit 2b selects one of the threshold temperatures based on the value of the current I flowing in the semiconductor switch 1a and outputs the advance warning signal.

As one example, the current I flowing in the semiconductor switch 1a is monitored and when the current I has reached the current I1, the threshold temperature T1 is selected so that an advance warning signal A1 is outputted when the temperature Th of the semiconductor switch 1a is the threshold temperature T1, which is before the overheating protection temperature Tr is reached.

Similarly, the current I flowing in the semiconductor switch 1a is monitored and when the current I has reached the current I2, the threshold temperature T2 is selected so that an advance warning signal A2 is outputted when the temperature Th of the semiconductor switch 1a is the threshold temperature T2, which is before the overheating protection temperature Tr is reached.

In addition, the current I flowing in the semiconductor switch 1a is monitored and when the current I has reached the current I3, the threshold temperature T3 is selected so that an advance warning signal A3 is outputted when the temperature Th of the semiconductor switch 1a is the threshold temperature T3, which is before the overheating protection temperature Tr is reached.

Note that although the advance warning signals A1 to A3 are signals with the same level, as described above, the timing at which these signals are outputted differs according to the current flowing in the semiconductor switch 1a, that is, the temperature of the semiconductor switch 1a.

In this way, the semiconductor device 1-1 is configured so that a plurality of threshold temperatures with respectively different values that are lower than the overheating protection temperature are set, a threshold temperature is selected in accordance with the current flowing in the semiconductor switch 1a, and when the detected temperature reaches the selected threshold temperature, an advance warning signal is outputted before overheating protection becomes operational.

By doing so, it is possible to output advance warning signals at different times in accordance with the overheating state of the semiconductor switch 1a. Since it is possible to output an advance warning signal quickly or slowly in accordance with the overheating state of the semiconductor switch 1a, it is possible to facilitate maintenance and operation.

Note that in the present embodiments, at least two threshold temperatures are set. Although an example where three threshold temperatures are set has been described above, it is also possible to set two or four or more threshold temperatures.

In addition, although an example where at least two threshold temperatures are set has been described above, it is also possible to use a configuration where only one threshold temperature is set and an advance warning corresponding to this threshold temperature is issued. When only one threshold temperature is set, since an advance warning is obtained before an alarm is issued and the operation of the semiconductor switch stops, it is possible to take measures, such as lowering the operating speed of the semiconductor switch and preparing for the semiconductor switch stopping.

It is also possible to output the advance warning using the same terminal as the terminal that outputs an alarm. When doing so, it is possible to set the signal level of the advance warning and the signal level of the alarm at different signal levels. By outputting the advance warning and the alarm from the same terminal but with different signal levels, it is possible to avoid an increase in the number of terminals and compared to a case where the advance warning and the alarm are outputted from the same terminal but with different signal widths, it is possible to quickly distinguish between the two types of signal.

In addition, it is possible to apply the content described above to a standalone drive circuit used for a semiconductor switch equipped with a temperature sensor (i.e., a configuration that is separate to the semiconductor switch) and thereby achieve the same effects.

Second Embodiment

Figure 2:
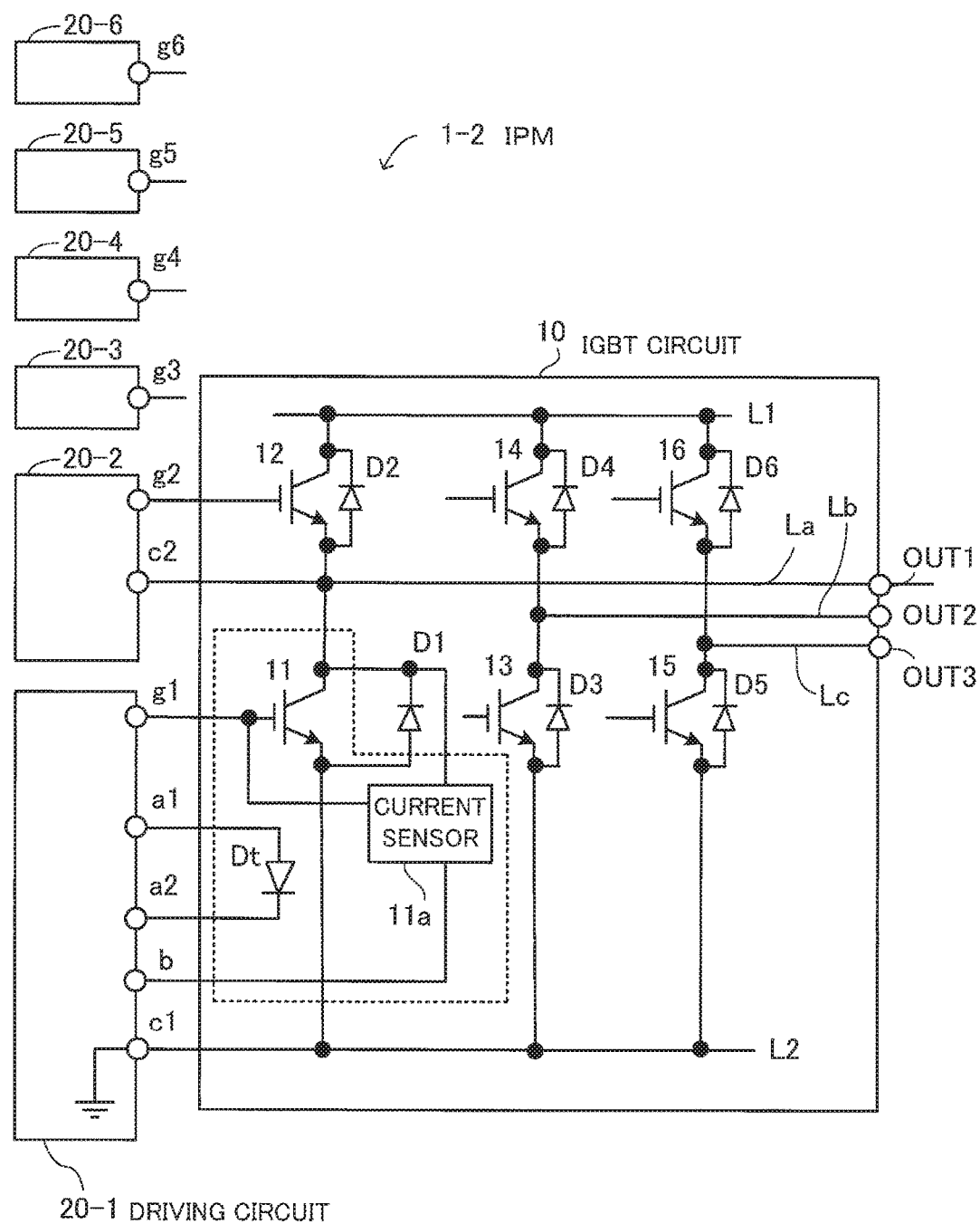
FIG. 2 depicts an example of the overall configuration of an IPM.

A case where the semiconductor device according to the present embodiments is applied to an IPM is described in detail below. FIG. 2 depicts an example of the overall configuration of an IPM. IPM1-2 includes an IGBT circuit 10 and drive circuits 20-1 to 20-6.

The IPM1-2 is an example of a three-phase inverter that performs DC/AC (Direct Current/Alternating Current) conversion and supplies power to a load.

Note that the IGBT circuit 10 has the same configuration as the semiconductor switch 1a in FIG. 1A. The drive circuits 20-1 to 20-6 respectively have the same functions as the drive circuit 2 in FIG. 1A.

In the IGBT circuit 10, IGBT 11 to 16, which are the semiconductor switch 1a, and diodes D1 to D6 are disposed between a high voltage bus L1 and a ground bus L2. The IGBTs 11 to 16 are also connected to the drive circuits 20-1 to 20-6 that are used to drive the IGBT 11 to 16.

A load, not illustrated, is connected to output terminals OUT1 to OUT5 of the IGBT circuit 10, the IGBT circuit 10 converts a large DC voltage (for example, 600V) that flows on the bus L1 to three-phase AC, and supplies AC to the load via AC lines La, Lb, and Lc.

Also, since the IGBT circuit 10 switches the current of an inductive load, such as a motor, on and off to drive the load, the diodes D1 to D6 that are freewheeling diodes (FWD) are connected to the IGBT 11 to 16 to allow the load current to fly back.

That is, since a back electromotive force from the inductive load, such as a motor, is produced at the moment when the IGBT 11 to 16 are turned off, the diodes D1 to D6 are connected in antiparallel to the respective IGBT 11 to 16 to allow the load current at this time to fly back.

On the other hand, the IGBTs 11 to 16 have temperature detecting diodes and current sensors mounted on the same chip. Although the IGBT 11, the temperature detecting diode Dt, and a current sensor 11a are depicted as been mounted on the same chip in the dotted box in FIG. 2, the other IGBT have the same configuration. Note that the internal configurations of the drive circuits 20-1 to 20-6 also have the same fundamental configuration.

The connection relationship between the elements of the IGBT circuit 10 will now be described. The gate of the IGBT 11 is connected to a terminal g1 of the drive circuit 20-1 and one end of the current sensor 11a, and the gate of the IGBT 12 is connected to a terminal g2 of the drive circuit 20-2.

In the same way, the gate of the IGBT 13 is connected to a terminal g3 of the drive circuit 20-3, and the gate of the IGBT 14 is connected to a terminal g4 of the drive circuit 20-4. The gate of the IGBT 15 is connected to a terminal g5 of the drive circuit 20-5, and the gate of the IGBT 16 is connected to a terminal g6 of the drive circuit 20-6.

The collector of the IGBT 12 is connected to the cathodes of the diodes D2, D4, and D6, and the collectors of the IGBT 14 and 16 are connected to the bus L1.

The emitter of the IGBT 12 is connected to the anode of the diode D2. In addition, the emitter of the IGBT 12 is connected via the AC line La to a terminal c2 of the drive circuit 20-2, the collector of the IGBT 11, the cathode of the diode D1, the other end of the current sensor 11a, and the output terminal OUT 1.

The emitter of the IGBT 14 is connected via the AC line Lb to the anode of the diode D4, the collector of the IGBT 13, the cathode of the diode D3, and the output terminal OUT 2.

The emitter of the IGBT 16 is connected via the AC line Lc to the anode of the diode D6, the collector of the IGBT 15, the cathode of the diode D5, and the output terminal OUT 3.

The emitter of the IGBT 11 is connected to a terminal c1 of the drive circuit 20-1, the anodes of the diodes D1, D3, and D5, the emitters of the transistors 13 and 15, and the bus L2. The terminal c1 of the drive circuit 20-1 is also connected to ground.

The output terminal of the current sensor 11a is connected to a terminal b of the drive circuit 20-1, the anode of the diode Dt is connected to a terminal a1 of the drive circuit 20-1, and the cathode of the diode Dt is connected to a terminal a2 of the drive circuit 20-1.

Figure 3:
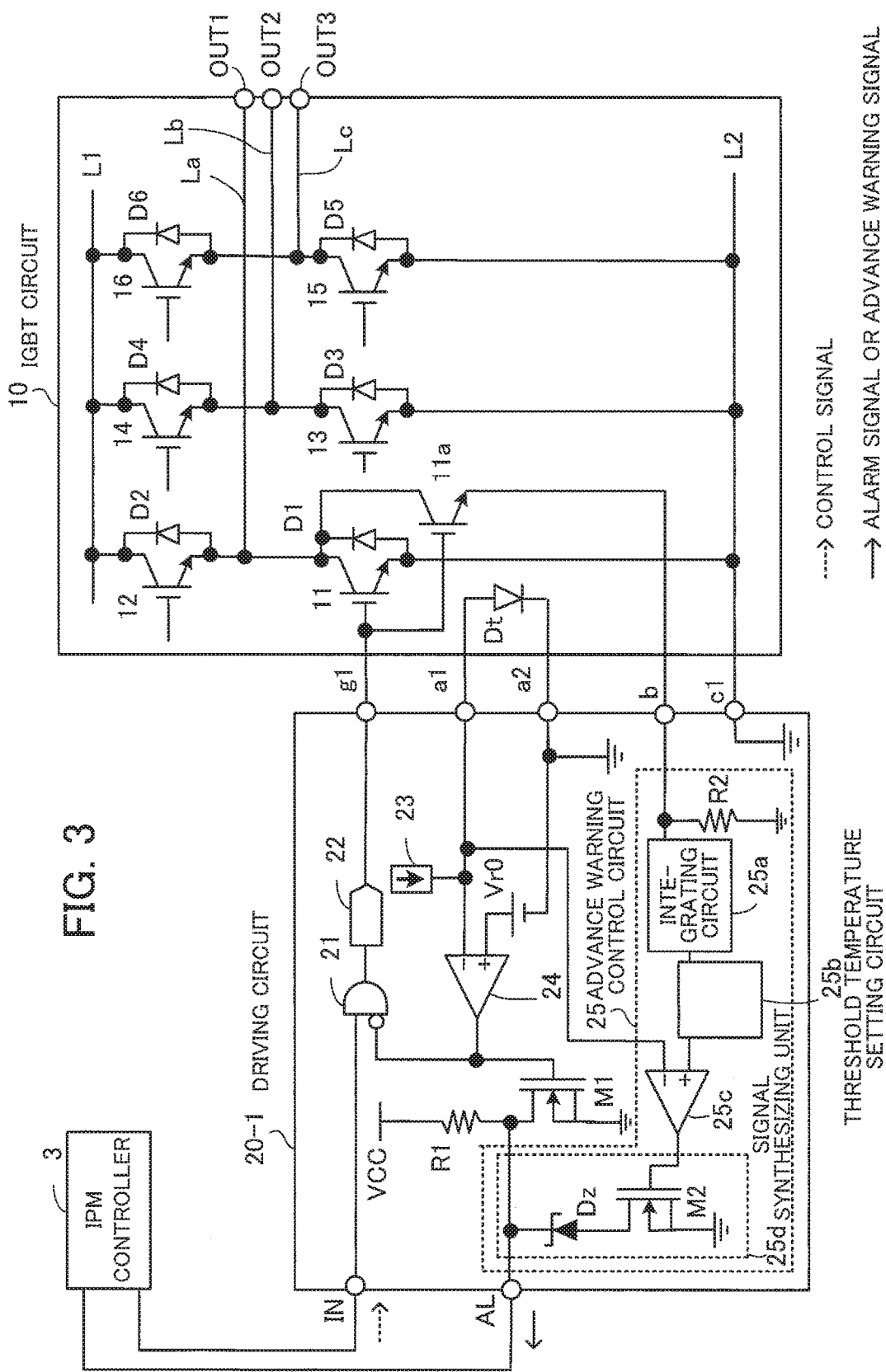
FIG. 3 depicts an example configuration of a drive circuit.

FIG. 3 depicts an example configuration of a drive circuit. Since the drive circuits 20-1 to 20-6 have the same fundamental configuration, in the following description the drive circuit 20-1 connected to the IGBT 11 is described.

Note that a transistor (referred to as the "transistor 11a") is used as the current sensor 11a depicted in FIG. 2. The gate of the transistor 11a is connected to a terminal g1 of the drive circuit 20-1 and the gate of the IGBT 11.

The collector of the transistor 11a is connected via the AC line La to the anode of the diode D2, the emitter of the IGBT 12, the collector of the IGBT 11, the cathode of the diode D1, and the output terminal OUT1. The emitter of the transistor 11a is connected to the terminal b of the drive circuit 20-1.

An IPM controller (control apparatus) 3 that provides drive instructions for the IGBT circuit 10 is connected to the drive circuit 20-1 (the IPM controller 3 is also connected to the drive circuits 20-2 to 20-6 depicted in FIG. 2). Note that the IPM controller 3 is connected to a control room where an administrator performs maintenance and operation, so that as one example, the IPM is controlled based on instructions from the control room.

The drive circuit 20-1 is equipped with a logic element 21, a predriver 22, a current source (constant current source) 23, a comparator 24, an advance warning control circuit 25, a resistor R1, a transistor M1, and a reference voltage source Vr0.

The advance warning control circuit 25 includes a signal synthesizing unit 25d, which is composed of a Zener diode Dz (hereinafter simply "diode Dz") and a transistor M2, a resistor R2, an integrating circuit 25a, a threshold temperature setting circuit 25b, and a comparator 25c. An example where N-channel MOSFETs (Metal Oxide Semiconductor Field Effect Transistors) are used as the transistors M1 and M2 is illustrated.

An alarm signal or advance warning signal is outputted from an alarm terminal AL of the drive circuit 20-1. Note that the alarm signal is a signal outputted during overheating protection or when overheating protection has been stopped. With the circuit configuration of the drive circuit 20-1, when the alarm signal is at an L level (a second voltage level), this indicates a state where overheating protection is operational, while when the alarm signal is at an H level (a first voltage level), this indicates a state where overheating protection has been stopped.

The advance warning control circuit 25 outputs the advance warning signal when there are signs of an overheating operation of the IGBT 11. Here, control is carried out to vary the time for which the advance warning signal is outputted in accordance with the overheating state of the IGBT 11.

Next, the connection relationship between the elements in the drive circuit 20-1 will be described. One end of the resistor R1 is connected to a power supply voltage VCC (for example, 15V) of the drive circuit 20-1, and the other end of the resistor R1 is connected to the alarm terminal AL of the drive circuit 20-1, the cathode of the diode Dz, and the drain of the transistor M1.

The source of the transistor M1 is connected to ground, and the gate of the transistor M1 is connected to a negative input terminal of the logic element 21 and an output terminal of the comparator 24.

An input terminal IN of the drive circuit 20-1 is connected to a positive input terminal of the logic element 21, and an output terminal of the logic element 21 is connected to an input terminal of the predriver 22. An output terminal of the predriver 22 is connected to the terminal g1 of the drive circuit 20-1.

The (−) input terminal of the comparator 24 is connected to an output end of a current source 23, the (−) input terminal of the comparator 25*c*, and a terminal a1 of the drive circuit 20-1. The (+) input terminal of the comparator 24 is connected to a positive electrode terminal of the reference voltage source Vr0, and a negative electrode terminal of the reference voltage source Vr0 is connected to ground and the terminal a2 of the drive circuit 20-1.

The terminal b of the drive circuit 20-1 is connected to one end of the resistor R2 and to an input end of the integrating circuit 25*a*, and the other end of the resistor R2 is connected to ground.

The output end of the integrating circuit 25*a* is connected to the input end of the threshold temperature setting circuit 25*b*, and the output end of the threshold temperature setting circuit 25*b* is connected to the (+) input terminal of the comparator 25*c*. The output terminal of the comparator 25*c* is connected to the gate of the transistor M2, the drain of the transistor M2 is connected to the anode of the diode Dz, and the source of the transistor M2 is connected to ground.

Next, the operation of the drive circuit 20-1 will be described. During normal operation, a control signal is transmitted from the IPM controller 3 on a higher level in the control hierarchy. The control signal is a pulsed signal (PWM (pulse width modulation) signal) that repeatedly alternates between an H level and an L level.

The control signal transmitted from the IPM controller 3 is inputted via the input terminal IN into the drive circuit 20-1. When the control signal is at the H level, since a gate voltage is applied via the terminal g1 to the IGBT 11, the IGBT 11 is turned on and the IGBT 11 enters a conductive state. When the control signal is at the L level, the IGBT 11 is turned off and the IGBT 11 enters a non-conductive state.

Next, the overheating protection function will be described. The current outputted from the current source 23 passes, via the terminal a1, through the anode of the temperature detecting diode Dt that is on the same chip as the IGBT 11, flows to the cathode, and is then inputted via the terminal a2 back into the drive circuit 20-1 and flows to ground.

The voltage of the terminal a1 is the forward voltage of the temperature detecting diode Dt (i.e., the voltage drop when a current flows in the forward direction. When the temperature of the IGBT 11 rises, the forward voltage of the temperature detecting diode Dt that is on the same chip as the IGBT 11 gradually falls.

Figure 4:
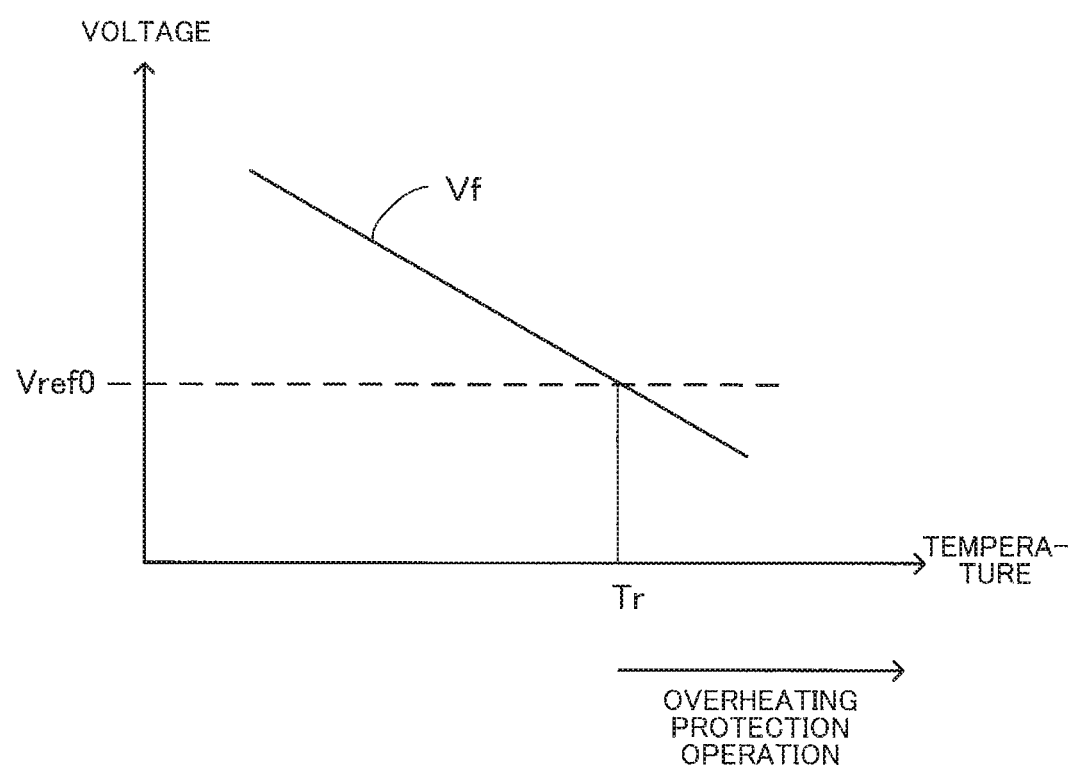
FIG. 4 depicts a temperature setting that is a threshold for performing overheating protection.

FIG. 4 depicts a temperature setting that is the threshold for performing overheating protection. The vertical axis designates voltage and the horizontal axis designates temperature. When the temperature of the IGBT 11 rises, the forward voltage Vf of the temperature detecting diode Dt positioned close to the IGBT 11 has a characteristic of gradually falling as the temperature of the IGBT 11 rises.

When the voltage generated by the reference voltage source Vr0 in FIG. 3 is expressed as the reference voltage Vref0 (or "first reference voltage"), the reference voltage Vref0 and the temperature Tr (or "overheating protection temperature Tr") positioned at the intersection with the forward voltage Vf is the threshold for executing overheating protection. As one example, the overheating protection temperature Tr is 170±20° C.

Accordingly, when the temperature of the IGBT 11 becomes the overheating protection temperature Tr or above, the overheating protection function is activated and when the temperature of the IGBT 11 is below the overheating protection temperature Tr, the overheating protection function becomes inactive.

On the other hand, the comparator 24 depicted in FIG. 3 compares the forward voltage Vf and the reference voltage Vref0. When the reference voltage Vref0 is equal to or above the forward voltage Vf (Vf Vref0), the comparator outputs an H level signal, while when the reference voltage Vref0 is below the forward voltage Vf (Vref0<Vf), the comparator 24 outputs an L level signal.

Accordingly, when the temperature of the IGBT 11 is equal to or above the overheating protection temperature Tr, the comparator 24 outputs the H level signal, while when the temperature of the IGBT 11 is below the overheating protection temperature Tr, the comparator 24 outputs the L level signal.

For a configuration where overheating protection is activated when the temperature of the IGBT 11 is equal to or above the overheating protection temperature Tr, since the output of the comparator 24 is inputted into the negative input terminal of the logic element 21, due to the H level signal outputted from the comparator 24, the output of the logic element 21 becomes constant at the L level regardless of the level of the control signal. Accordingly, since the output of the predriver 22 is fixed also at the L level, the IGBT 11 that was in the overheating state is turned off.

Since the output of the comparator 24 is connected to the gate of the transistor M1, the transistor M1 is turned on and an L (ground) level alarm signal that signifies an overheating protection operation is outputted from the alarm terminal AL.

On the other hand, when the temperature of the IGBT 11 is below the overheating protection temperature Tr, overheating protection is not activated. Since the comparator 24 outputs an L level signal at this time, the output of the logic element 21 is at a level in keeping with the level of the control signal. Accordingly, the control signal is applied via the predriver 22 to the gate of the IGBT 11 so as to drive the IGBT 11.

Since an L level signal from the comparator 24 is inputted into the gate of the transistor M1, the transistor M1 is turned off and an H (VCC) level alarm signal that signifies that overheating protection is stopped is outputted from the alarm terminal AL.

Next, the relationship between the level of the alarm signal and the level of the control signal when the temperature of the IGBT 11 is rising will be described.

Figure 5:
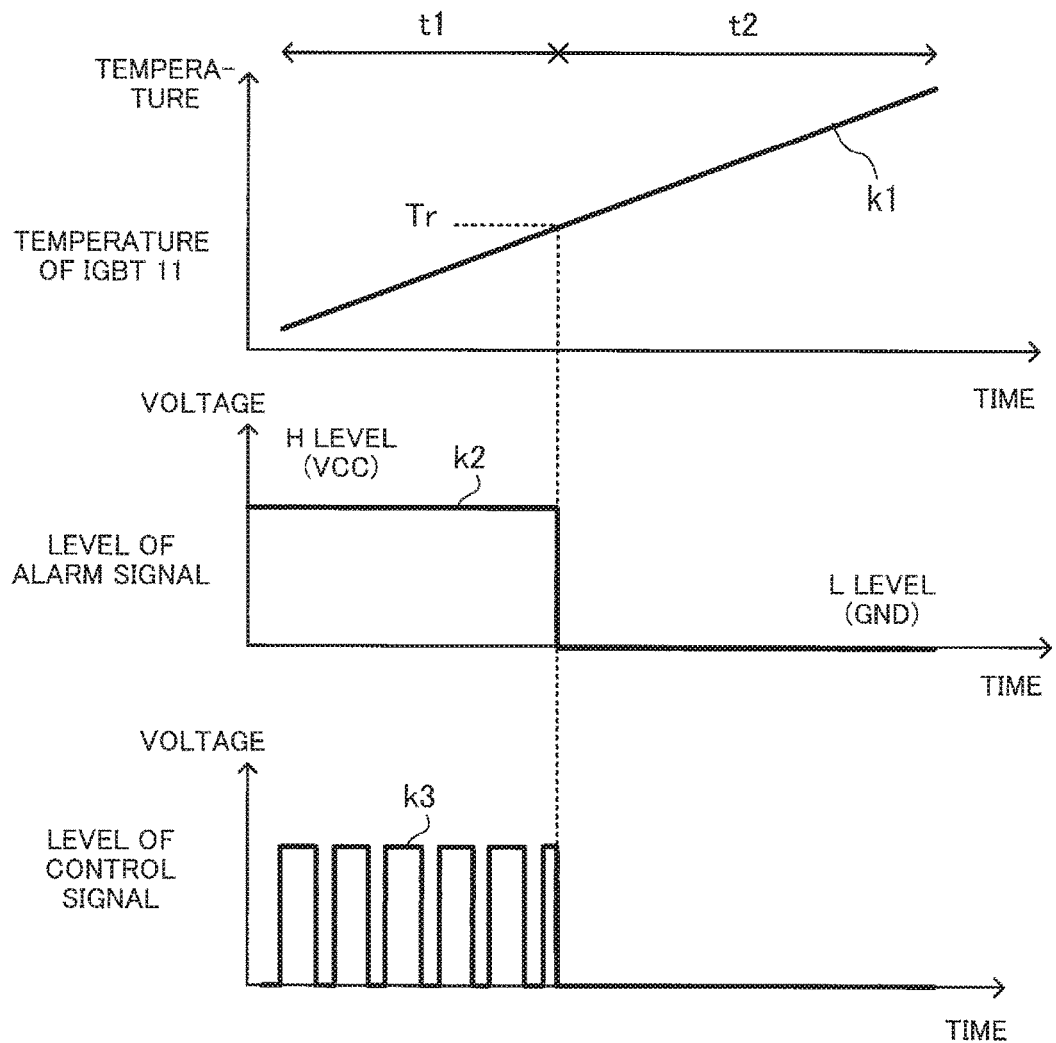
FIG. 5 depicts the relationship between the level of an alarm signal and the level of a control signal when the temperature of an IGBT is rising.

FIG. 5 depicts the relationship between the level of the alarm signal and the level of the control signal when the temperature of the IGBT is rising. The graph k1 depicts the temperature of the IGBT 11. The graph k2 depicts the level of the alarm signal (the level of the alarm terminal AL), and the graph k3 depicts the level of the control signal (the level of the input terminal IN).

(Time period t1) This is when the temperature of the IGBT 11 is below the overheating protection temperature Tr. At this time, due to the overheating protection stopped state, the level of the alarm signal is the H (VCC) level.

On receiving an alarm signal with the H level, the IPM controller 3 depicted in FIG. 3 recognizes the overheating protection stopped state and outputs a normal control signal (pulse waveform) for driving the IGBT 11.

(Time zone t2) This is when the temperature of the IGBT 11 is equal to or above the overheating protection temperature Tr. At this time, due to the overheating protection operational state, the level of the alarm signal is the L (ground) level.

On receiving an alarm signal with the L level, the IPM controller 3 recognizes the overheating protection operational state and fixes the control signal at the L level to stop the driving of the IGBT 11.

Next, the advance warning control circuit 25 will be described. The transistor 11a in the IGBT circuit 10 depicted in FIG. 3 is a current sensor for the current flowing in the IGBT 11 and outputs a current signal that is proportionate to the current flowing in the IGBT 11.

The current signal outputted from the transistor 11a is inputted into the drive circuit 20-1 via the terminal b, the voltage drops by an amount in keeping with the resistance of the resistor R2, and the resulting voltage signal is inputted into the integrating circuit 25a. The integrating circuit 25a carries out waveform shaping through low pass filtering of the inputted voltage signal.

Figure 6:
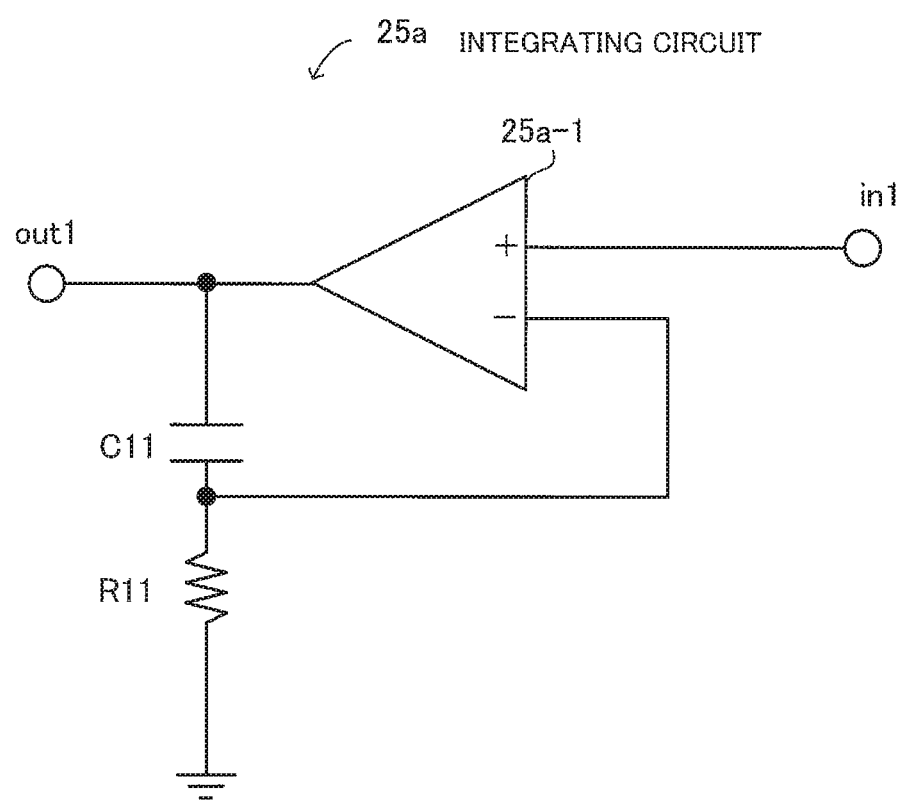
FIG. 6 depicts an example configuration of an integrating circuit.

FIG. 6 depicts an example configuration of the integrating circuit. The integrating circuit 25a includes an operational amplifier 25a-1, a capacitor C11, and a resistor R11.

The elements are connected so that the (+) input terminal of the operational amplifier 25a-1 is connected to an input terminal in1. The input terminal in1 is connected to one end of the resistor R2 depicted in FIG. 3, the terminal b of the drive circuit 20-1, and the emitter of the transistor 11a in the IGBT circuit 10.

The output terminal of the operational amplifier 25a-1 is connected to an output terminal out1 and one end of the capacitor C11. The (−) input terminal of the operational amplifier 25a-1 is connected to the other end of the capacitor C11 and one end of the resistor R11, and the other end of the resistor R1 is connected to ground.

A voltage signal that has been subjected to waveform shaping in proportion to the current of the IGBT 11 is outputted from the output terminal out1 of the integrating circuit 25a and is transmitted to the threshold temperature setting circuit 25b.

Figure 7:
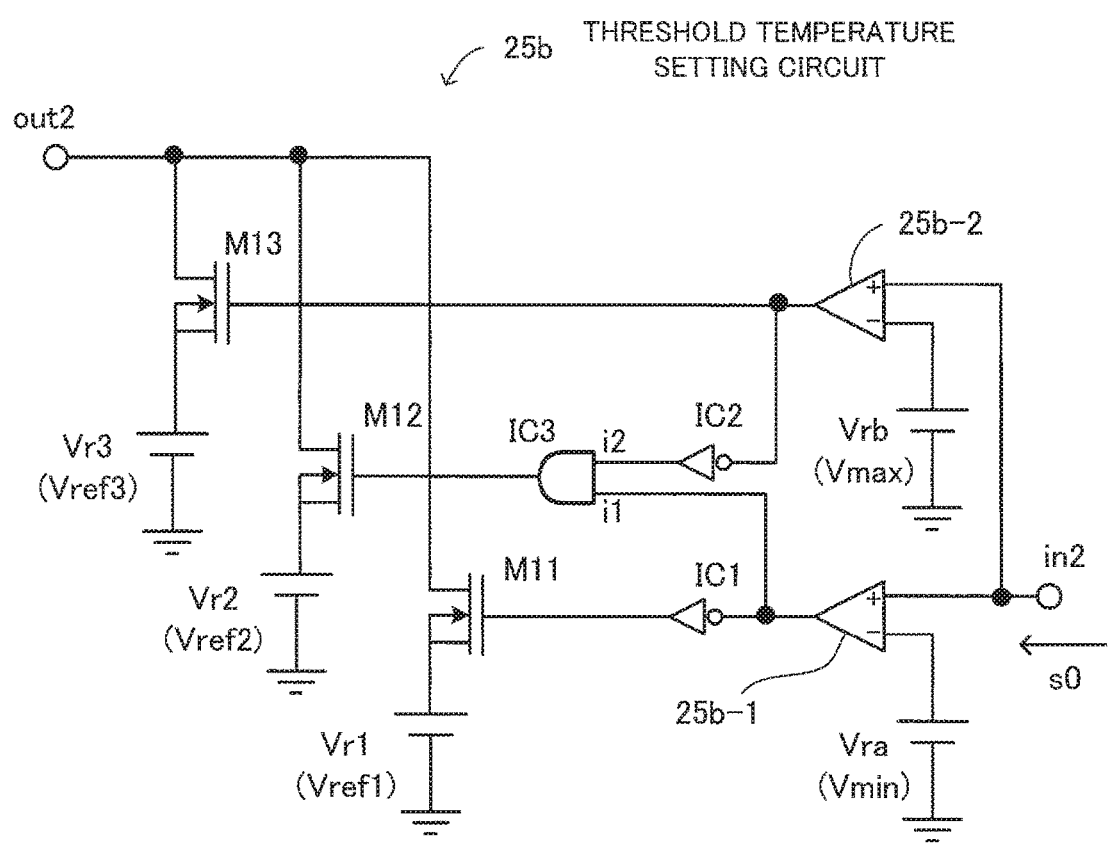
FIG. 7 depicts an example configuration of a threshold temperature setting circuit.

FIG. 7 depicts an example configuration of the threshold temperature setting circuit. The threshold temperature setting circuit 25b includes comparators 25b-1 and 25b-2, N-channel MOS transistors M11 to M13, inverters IC1 and IC2, an AND element IC3, reference voltage sources Vra and Vrb, and a group of reference voltage sources. The group of reference voltage sources includes reference voltage sources Vr1 to Vr3.

The elements are connected so that the input terminal in2 is connected to the output terminal out1 of the integrating circuit 25a, the (+) input terminal of the comparator 25b-1, and the (+) input terminal of the comparator 25b-2. The (−) input terminal of the comparator 25b-1 is connected to a positive electrode terminal of the reference voltage source Vra, and a negative electrode terminal of the reference voltage source Vra is connected to ground.

The (−) input terminal of the comparator 25b-2 is connected to a positive terminal of a reference voltage source Vrb, and a negative terminal of the reference voltage source Vrb is connected to ground.

The output terminal of the comparator 25b-1 is connected to the input terminal of the inverter IC1 and one input terminal i1 of the AND terminal IC3, and the output terminal of the inverter IC1 is connected to the gate of the transistor M11.

The output terminal of the comparator 25b-2 is connected to the input terminal of the inverter IC2 and the gate of the transistor M13, and the output terminal of the inverter IC2 is connected to the other input terminal i2 of the AND element IC3. The output terminal of the AND element IC3 is connected to the gate of the transistor M12.

The source of the transistor M11 is connected to the positive electrode terminal of the reference voltage source Vr1 and the negative electrode terminal of the reference voltage source Vr1 is connected to ground. The source of the transistor M12 is connected to the positive electrode terminal of the reference voltage source Vr2 and the negative electrode terminal of the reference voltage source Vr2 is connected to ground. The source of the transistor M13 is connected to the positive electrode terminal of the reference voltage source Vr3 and the negative electrode terminal of the reference voltage source Vr3 is connected to ground.

The output terminal out2 is connected to the drains of the transistors M11, M12, and M13 and to the (+) input terminal of the comparator 25c depicted in FIG. 3.

Note that the reference voltage generated by the reference voltage source Vra is set as "Vmin" and the reference voltage generated by the reference voltage source Vrb is set as "Vmax" where Vmin<Vmax.

The reference voltage generated by the reference voltage source Vr1 is set as "Vref1", the reference voltage generated by the reference voltage source Vr2 is set as "Vref2", the reference voltage generated by the reference voltage source Vr3 is set as "Vref3", and out of these voltages, it is assumed that the reference voltage Vref1 is the lowest and the reference voltage Vref3 is the highest. That is, the voltages are set as Vref3>Vref2>Vref1 (the reference voltages Vref3 to Vref1 correspond to the "second reference voltages".

Note that although an example configuration including the three reference voltage sources Vr1, Vr2, and Vr3 as the group of reference voltage sources is depicted in FIG. 7, a configuration with two or four or more reference voltage sources may be used (a number of reference voltage sources corresponding to the number of threshold temperatures to be set are provided).

The operation of the threshold temperature setting circuit 25b is described below with the voltage signal outputted from the integrating circuit 25a as the "signal s0" and the voltage level of the signal s0 as "V0".

(When V0≤Vmin)

The comparator 25b-1 compares the voltage v0 of the signal s0 and the reference voltage Vmin of the reference voltage source Vra. When the voltage V0 is equal to or below the reference voltage Vmin (V0≤Vmin), the output signal of the comparator 25b-1 becomes an L level.

Since the output signal of the comparator 25b-1 is inputted into the inverter IC1, the level of the output signal of the comparator 25b-1 is inverted by the inverter IC1. Accordingly, an H level is applied to the gate of the transistor M11 to turn on the transistor M11.

The output signal of the comparator 25*b*-1 is also inputted into the input terminal i1 of the AND element IC3. Since the output signal of the comparator 25*b*-1 is the L level, the output of the AND element IC3 becomes the L level and the transistor M12 is turned off.

On the other hand, the comparator 25*b*-2 compares the voltage V0 of the signal s0 and the reference voltage Vmax of the reference voltage source Vrb. Since the voltage V0 is below the reference voltage Vmax (V0≤Vmin<Vmax), the output signal of the comparator 25*b*-2 becomes an L level.

Since the output signal of the comparator 25*b*-2 is inputted into the gate of the transistor M13, the L level is applied to the gate of the transistor M13 to turn off the transistor M13.

Accordingly, when V0≤Vmin, the transistor M11 is turned on and the transistors M12 and M13 are turned off. This means that the output terminal out2 receives a voltage from the reference voltage source Vr1 so that voltage signal with the reference voltage Vref1 is outputted from the output terminal out2.

(When Vmin<V0<Vmax)

The comparator 25*b*-1 compares the voltage V0 of the signal s0 and the reference voltage Vmin of the reference voltage source Vra. When the voltage V0 exceeds the reference voltage Vmin (Vmin<V0), the output signal of the comparator 25*b*-1 becomes an H level.

Since the output signal of the comparator 25*b*-1 is inverted by the inverter IC1, an L level is applied to the gate of the transistor M11 to turn off the transistor M11.

The comparator 25*b*-2 compares the voltage V0 of the signal s0 and the reference voltage Vmax of the reference voltage source Vrb. Since the voltage V0 is below the reference voltage Vmax (V0<Vmax), the output signal of the comparator 25*b*-2 becomes an L level.

Since the output signal of the comparator 25*b*-2 is inputted into the gate of the transistor M13, the L level is applied to the gate of the transistor M13 to turn off the transistor M13.

On the other hand, since the output signal of the comparator 25*b*-2 is inputted into the inverter IC2, the level of the output signal of the comparator 25*b*-2 is inverted by the inverter IC2. Accordingly, the H level is inputted into the input terminal i2 of the AND element IC3. Since the output signal of the comparator 25*b*-1 is the H level, the H level is inputted into the input terminal i1 of the AND element IC3.

Accordingly, the output signal of the AND element IC3 becomes the H level and since the output signal of the AND element IC3 is inputted into the gate of the transistor M12, the transistor M12 is turned on.

Accordingly, when Vmin<V0<Vmax, the transistor M12 is turned on and the transistors M11 and M13 are turned off. This means that the output terminal out2 receives a voltage from the reference voltage source Vr2 so that a voltage signal with the reference voltage Vref2 is outputted from the output terminal out2.

(When Vmax≤V0)

The comparator 25*b*-1 compares the voltage V0 of the signal s0 and the reference voltage Vmin of the reference voltage source Vra. When the voltage V0 exceeds the reference voltage Vmin (Vmin<Vmax≤V0), the output signal of the comparator 25*b*-1 becomes the H level.

The output signal of the comparator 25*b*-1 is inputted into the inverter IC1 so that the level of the output signal of the comparator 25*b*-1 is inverted by the inverter IC1. Accordingly, the L level is applied to the gate of the transistor M11 to turn off the transistor M11.

The comparator 25*b*-2 compares the voltage V0 of the signal s0 and the reference voltage Vmax of the reference voltage source Vrb. Since the voltage V0 is equal to or above the reference voltage Vmax (Vmax≤V0), the output signal of the comparator 25*b*-2 becomes an H level.

Since the output signal of the comparator 25*b*-2 is inputted into the gate of the transistor M13, the H level is applied to the gate of the transistor M13 to turn on the transistor M13.

On the other hand, since the output signal of the comparator 25*b*-2 is inputted into the inverter IC2 and the level of the output signal of the comparator 25*b*-2 is inverted by the inverter IC2, the L level is inputted into the input terminal i2 of the AND element IC3.

Accordingly, the output signal of the AND element IC3 becomes the L level and since the L level is applied to the gate of the transistor M12, the transistor M12 is turned off.

Accordingly, when Vmax≤V0, the transistor M13 is turned on and the transistors M11 and M12 are turned off. This means that the output terminal out2 receives a voltage from the reference voltage source Vr3 so that a voltage signal with the reference voltage Vref3 is outputted from the output terminal out2.

In this way, the larger the current flowing in the IGBT 11 (the higher the detected temperature), the higher the reference voltage of the reference voltage source selected out of the group of reference voltage sources. That is, since the voltage V0 of the signal s0 is higher the larger the current flowing in the IGBT 11, when Vmax≤V0, the reference voltage source Vr3 with the highest reference voltage Vref3 is selected out of the reference voltage sources Vr1 to Vr3.

Also, when V0≤Vmin, the reference voltage source Vr1 with the lowest reference voltage Vref1 is selected out of the reference voltage sources Vr1 to Vr3.

Note that operational states of the threshold temperature setting circuit are depicted in FIG. 8. In Table 4, the output levels of the comparators, the level of the output terminal, and the switching states of the transistors are concisely depicted together for ease of understanding.

Figure 9:
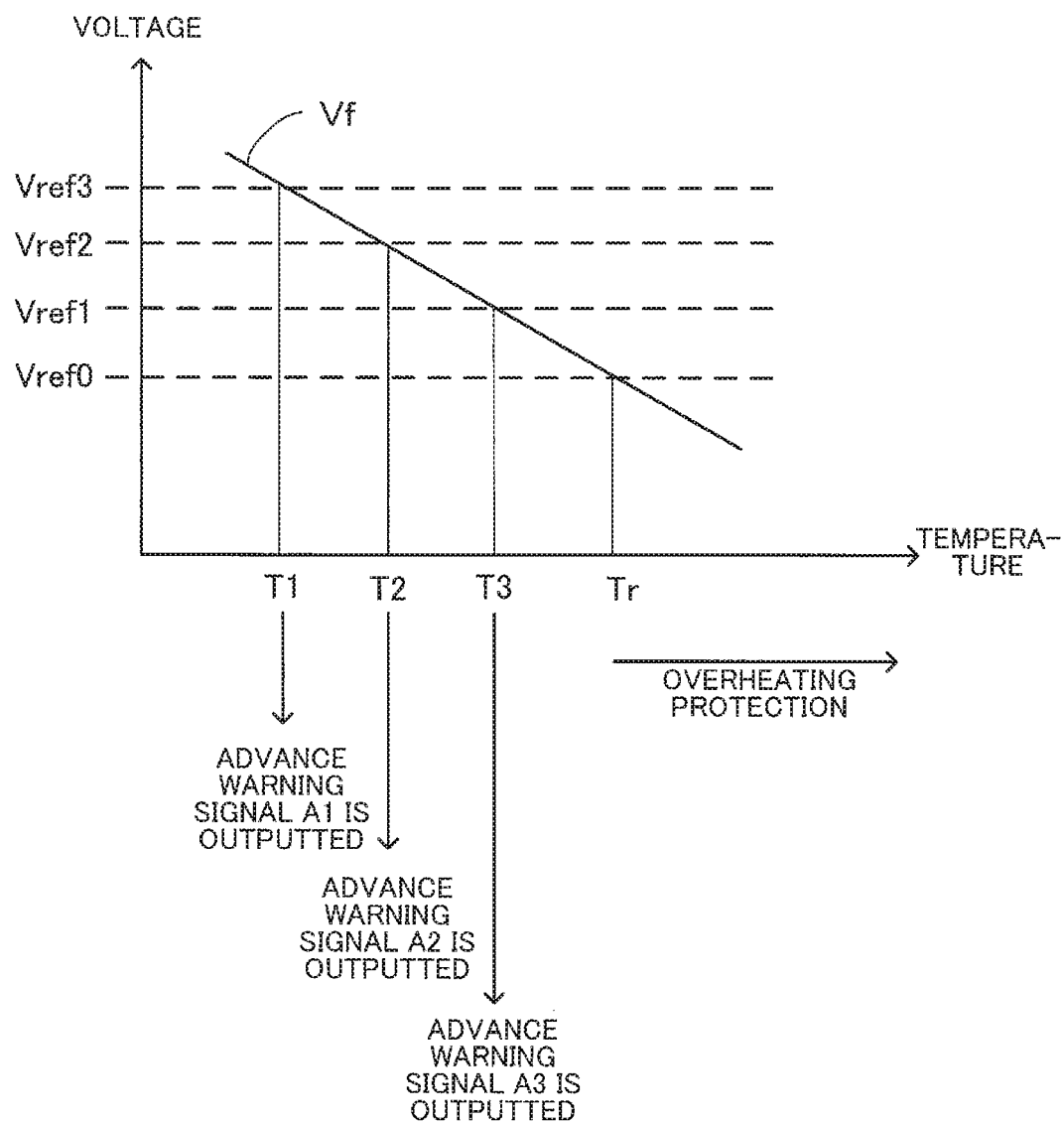
FIG. 9 depicts a setting of threshold temperatures.

Next, the setting of the threshold temperatures for issuing advance warnings will be described. FIG. 9 depicts the setting of threshold temperatures. The vertical axis designates voltage and the horizontal axis designates temperature. The intersection between the reference voltage Vref3 and the forward voltage Vf is the threshold temperature T1 for outputting the advance warning signal A1.

The intersection between the reference voltage Vref2 and the forward voltage Vf is the threshold temperature T2 for outputting the advance warning signal A2. The intersection between the reference voltage Vref1 and the forward voltage Vf is the threshold temperature T3 for outputting the advance warning signal A3.

Here, when the temperature of the IGBT 11 is below the temperature T1, none of the advance warning signals A1 to A3 is outputted (i.e., there is no overheating in this state).

When the temperature of the IGBT 11 has risen and reached the threshold temperature T1, the advance warning signal A1 is outputted toward the IPM controller 3.

When the IGBT 11 has risen further and reached the threshold temperature T2 (>T1), the advance warning signal A2 is outputted toward the IPM controller 3.

When the IGBT 11 has risen yet further and reached the threshold temperature T3 (>T2), the advance warning signal A3 is outputted toward the IPM controller 3.

In this way, when the current flowing in the IGBT 11 is large, that is, when the IGBT 11 is operating in a state where the temperature of the IGBT 11 is high and it is desirable to obtain advance warning quickly, as described earlier a high reference voltage is selected, and as a result, it is possible to quickly obtain advance warning when the temperature of the IGBT 11 has risen.

Here, the output terminal out2 of the threshold temperature setting circuit 25b depicted in FIG. 7 is connected to the (+) input terminal of the comparator 25c depicted in FIG. 3. The comparator 25c compares one of the reference voltages Vref1 to Vref3 outputted from the threshold temperature setting circuit 25b and the forward voltage Vf.

When the reference voltages Vref1 to Vref3 are equal to or larger than the forward voltage Vf (Vf≤Vref1, Vref2, Vref3), the comparator 25c outputs an H level signal, while when the reference voltages Vref1 to Vref3 are below the forward voltage Vf (Vref1, Vref2, Vref3<Vf), the comparator 25c outputs an L level signal.

Accordingly, when the operation temperature of the IGBT 11 is equal to or higher than the threshold temperature T1, the comparator 25c outputs the H level signal, while when the operation temperature of the IGBT 11 is below the threshold temperature T1, the comparator 25c outputs the L level signal.

When the temperature of the IGBT 11 is equal to or higher than the threshold temperature T1, output control for an advance warning signal is activated. Since the comparator 25c outputs the H level signal at this time, the transistor M2 is turned on and the voltage of the alarm terminal AL becomes the breakdown voltage of the Zener diode Dz. That is, an advance warning signal whose level is the breakdown voltage of the Zener diode Dz is outputted from the alarm terminal AL.

Next, the relationship between the level of the advance warning signal and the level of the control signal when the temperature of the IGBT 11 is rising will be described.

Figure 10:
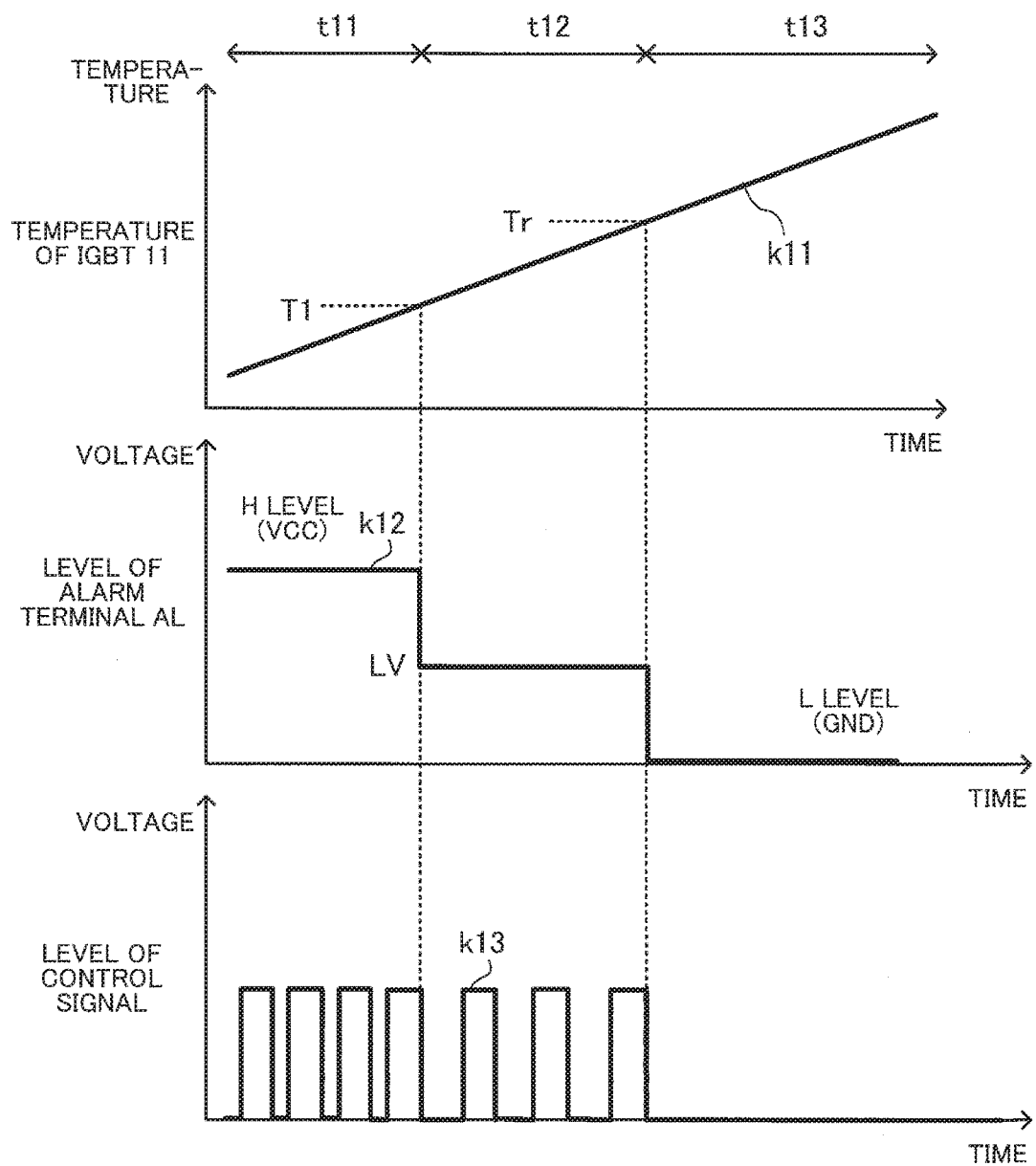
FIG. 10 depicts the relationship between the level of an advance warning signal and the level of a control signal when the temperature of the IGBT is rising.

FIG. 10 depicts the relationship between the level of the advance warning signal and the level of the control signal when the temperature of the IGBT 11 is rising. The graph k11 depicts the temperature of the IGBT 11, the graph k12 depicts the level of the alarm terminal AL (the levels of the advance warning signal and the alarm signal), and the graph k13 depicts the level of the control signal (the level of the input terminal IN).

(Time period t11) This is when the temperature of the IGBT 11 is below the threshold temperature T1. At this time, due to the overheating protection stopped state, the level of the alarm terminal AL (the level of the alarm signal) is the H (VCC) level.

On receiving the alarm signal with the H level, the IPM controller 3 recognizes the overheating protection stopped state and, to drive the IGBT 11, outputs a normal control signal where the H level and L level alternate at a given frequency (the first frequency).

(Time period t12) This is when the temperature of the IGBT 11 is equal to or above the threshold temperature T1 but is below the overheating protection temperature Tr. In this state, overheating protection remains in the stopped state but an advance warning is outputted, so that the level of the alarm terminal AL (the level of the advance warning signal) becomes a voltage level LV that is between VCC and ground (more specifically, the value of the drop voltage of the Zener diode Dz described earlier).

On receiving the advance warning signal with the voltage level LV, the IPM controller 3 recognizes a state that is a precursor to an overheating protection operation being performed and lowers the pulse frequency of the control signal (i.e., changes to a second frequency that is lower than the first frequency) to reduce the speed of switching operations by the IGBT 11. By doing so, it is possible to delay or avoid a state where an alarm signal is issued, that is, a state where the operation of the IGBT 11 stops. By delaying the stopping of operation of the IGBT 11, it becomes possible to implement various measures. Note that in place of lowering the pulse frequency of the control signal, the same effect can be achieved by changing the duty ratio of a pulsed control signal with a constant frequency so as to reduce the time where the IGBT 11 is on.

(Time period t13) This is when the temperature of the IGBT 11 is equal to or above the overheating protection temperature Tr. Due to the overheating protection operational state at this time, the level of the alarm terminal AL (the level of the alarm signal) is the L (ground) level.

On receiving the alarm signal at a certain level (the L level), the IPM controller 3 recognizes the overheating protection operational state and fixes the control signal at the L level to stop the driving of the IGBT 11.

Next, the outputting of the alarm signal and the advance warning signal from a single pin in the drive circuit 20-1 will be described. As depicted in FIG. 3, the drive circuit 20-1 has a circuit configuration where both the alarm signal and the advance warning signal are outputted from the alarm terminal AL that is a single output pin.

More specifically, the alarm terminal AL is connected to the other end of a pull-up resistor R1, the drain of the transistor M1, and the cathode of the Zener diode Dz. The anode of the Zener diode Dz is connected to the drain of the transistor M2.

As described earlier, with this circuit configuration, since the transistor M1 is turned off (the transistor M2 is off), in the overheating protection stopped state, the alarm terminal AL becomes the H (VCC) level (i.e., the alarm signal becomes the H level).

In the overheating protection operational state, since the transistor M1 is turned on (the transistor M2 is off), the alarm terminal AL becomes the L (ground) level (i.e., the alarm signal becomes the L level).

In addition, in the state that is a precursor to overheating protection becoming operational, since the transistor M2 becomes on (the transistor M1 is off), a voltage drop equivalent to the drop voltage of the Zener diode Dz is produced and the alarm terminal AL becomes the drop voltage level of the Zener diode Dz (the advance warning signal becomes the drop voltage level of the Zener diode Dz).

In this way, a configuration is used where a signal with three different levels is outputted from a single output pin to notify the IPM controller 3 of three states, namely the overheating protection stopped state, the overheating protection operational state, and the overheating protection precursor state, as the state of the IGBT circuit 10. By doing so, it is possible to give notification of a plurality of states from a single pin and thereby reduce the scale of the circuit.

As described above, according to the present embodiments, by making it possible to output an advance warning signal at different times, it is possible to facilitate maintenance and operations. As one example, when the controller of an IPM receives an advance warning signal at early timing, it becomes possible to implement appropriate driving control for the present overheating state in a short time before an overheating protection operational state occurs.

Although a configuration where at least two threshold temperatures are set has been described, as mentioned earlier it is also possible to set only one threshold temperature and to issue an advance warning corresponding to this threshold temperature. When only one threshold temperature is set, since advance warning is obtained before an alarm is issued and the operation of the semiconductor switch stops, it becomes possible to implement measures such as reducing the operating speed of the semiconductor switch and preparing for the semiconductor switch stopping.

It is also possible to output the advance warning using the same terminal as the terminal that outputs the alarm. When doing so, it is possible to set the signal level of the advance warning and the signal level of the alarm at different signal levels. By outputting the advance warning and the alarm with different signal levels from the same terminal in this way, it is possible to avoid an increase in the number of terminals, and compared to a case where the advance warning and the alarm are outputted from the same terminal so as to be distinguished by signal width, it is possible to distinguish between the signals more quickly.

In addition, it is possible to apply the content described above to a standalone drive circuit used for a semiconductor switch equipped with a temperature sensor (i.e. a configuration that is separate to a semiconductor switch) and thereby achieve the same effects.

According to the embodiments described above, it is possible to facilitate operation and maintenance by changing the output timing of an advance warning in keeping with an overheating state.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    a semiconductor switch circuit, including a semiconductor switch and a temperature sensor that detects a temperature of the semiconductor switch in a periphery of the semiconductor switch; and
    a drive circuit, including
        an overheating protection unit configured to, upon determining that the detected temperature of the semiconductor switch reaches an overheating protection temperature, perform overheating protection of the semiconductor switch and issue an overheating protection alarm signal; and
        an advance warning control unit configured to set a threshold temperature that is lower than the overheating protection temperature, and upon determining that the detected temperature reaches the threshold temperature, output an advance warning signal before the overheating protection becomes operational, wherein
        the overheating protection alarm signal and the advance warning signal are outputted from a same terminal of the drive circuit and are of different signal levels.

2. The semiconductor device according to claim 1, wherein
    the semiconductor switch circuit includes a temperature detecting diode in the periphery of the semiconductor switch,
    the overheating protection unit compares a forward voltage of the temperature detecting diode and a first reference voltage corresponding to the overheating protection temperature, and upon determining that the first reference voltage is equal to or above the forward voltage, performs the overheating protection and outputs the overheating protection alarm signal to indicate an operational state of the overheating protection,
    the threshold temperature includes a plurality of different threshold temperatures,
    the advance warning control unit includes a plurality of reference voltage sources that generate a plurality of second reference voltages respectively corresponding to the different threshold temperatures, and
    the advance warning control unit compares the forward voltage and the second reference voltages, and outputs, upon determining that one of the second reference voltages is equal to or above the forward voltage, the advance warning signal before the overheating protection becomes operational.

3. The semiconductor device according to claim 2, wherein the advance warning control unit has an output end for outputting the advance warning signal and a Zener diode connected to the output end, and outputs a drop voltage of the Zener diode as a level of the advance warning signal.

4. The semiconductor device according to claim 1, further comprising
    a control apparatus that is connected to the drive circuit and that transmits a control signal to the drive circuit to provide driving instructions for the semiconductor switch, wherein
    the control apparatus transmits the control signal with a frequency corresponding to a signal level of the terminal from which the overheating protection alarm signal and the advance warning signal are outputted.

5. The semiconductor device according to claim 1, wherein the drive circuit further includes a driving control circuit configured to drive and control the semiconductor switch.

6. A semiconductor device, comprising:
    a semiconductor switch circuit, including a semiconductor switch and a temperature sensor that detects a temperature of the semiconductor switch in a periphery of the semiconductor switch; and
    a drive circuit, including
        an overheating protection unit configured to
            compare the detected temperature of the semiconductor switch and an overheating protection temperature, and
            upon determining that the detected temperature of the semiconductor switch reaches the overheating protection temperature, perform overheating protection of the semiconductor switch, and issue an overheating protection alarm signal to indicate an operational state for the overheating protection of the semiconductor switch; and
        an advance warning control unit configured to
            compare the detected temperature of the semiconductor switch and a plurality of threshold temperatures that are each lower than the overheating protection temperature, and
            upon determining that the detected temperature reaches one of the threshold temperatures, output an advance warning signal before the overheating protection becomes operational.

7. The semiconductor device according to claim 6, wherein
    the overheating protection unit compares a voltage corresponding to the detected temperature of the temperature sensor and a first reference voltage corresponding to the overheating protection temperature and performs, upon determining that the first reference voltage is equal to or above the voltage, overheating protection and outputs an alarm signal indicating an operational state of the overheating protection, and the advance warning control unit includes a plurality of reference voltage sources to generate the plurality of second reference voltages, compares the voltage and the second reference voltage and issues, upon determining that the second reference voltage is equal to or above the voltage, the advance warning signal.

8. The semiconductor device according to claim 7, wherein the advance warning control unit selects one of the plurality of reference voltage sources so that the larger is a current flowing in the semiconductor switch, the higher is the second reference voltage of the selected reference voltage source.

9. The semiconductor device according to claim 6, wherein the drive circuit further includes a driving control circuit configured to drive and control the semiconductor switch.

10. A method of a semiconductor device including a semiconductor switch for detecting a temperature rise of the semiconductor switch and outputting an alarm, the method comprising:

detecting a temperature of the semiconductor switch;

responsive to determination that the detected temperature reaches an overheating protection temperature, performing overheating protection of the semiconductor switch and issuing an overheating protection alarm signal; and setting a threshold temperature that is lower than the overheating protection temperature, and responsive to determination that the detected temperature reaches the threshold temperature, outputting an advance warning signal before the overheating protection becomes operational, the advance warning signal and the overheating protection alarm signal being outputted from a same terminal and being of different signal levels.

\* \* \* \* \*